United States Patent
Kasai

(10) Patent No.: US 9,560,454 B2
(45) Date of Patent: Jan. 31, 2017

(54) ACOUSTIC TRANSDUCER

(71) Applicant: OMRON Corporation, Kyoto-shi, Kyoto (JP)

(72) Inventor: Takashi Kasai, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/772,084

(22) PCT Filed: Sep. 9, 2013

(86) PCT No.: PCT/JP2013/074207
§ 371 (c)(1),
(2) Date: Sep. 2, 2015

(87) PCT Pub. No.: WO2014/141506
PCT Pub. Date: Sep. 18, 2014

(65) Prior Publication Data
US 2016/0014528 A1    Jan. 14, 2016

(30) Foreign Application Priority Data
Mar. 11, 2013  (JP) ................................. 2013-048529

(51) Int. Cl.
*H04R 25/00*     (2006.01)
*H04R 19/00*     (2006.01)
*H04R 19/04*     (2006.01)
*H04R 31/00*     (2006.01)

(52) U.S. Cl.
CPC ............ *H04R 19/00* (2013.01); *H04R 19/005* (2013.01); *H04R 19/04* (2013.01); *H04R 31/00* (2013.01); *H04R 2410/07* (2013.01)

(58) Field of Classification Search
CPC ....... H04R 19/00; H04R 19/005; H04R 19/04; H04R 31/00; H04R 2410/07
USPC .......................................................... 381/191
See application file for complete search history.

(56) References Cited

U.S. PATENT DOCUMENTS

| 2010/0176821 | A1* | 7/2010 | Kasai | ..................... H04R 19/04 |
| | | | | 324/660 |
| 2010/0278372 | A1* | 11/2010 | Zhang | ..................... H04R 1/222 |
| | | | | 381/412 |
| 2011/0280419 | A1* | 11/2011 | Kasai | ..................... H04R 19/005 |
| | | | | 381/176 |
| 2012/0033831 | A1 | 2/2012 | Leitner | |

(Continued)

FOREIGN PATENT DOCUMENTS

JP         2010-034641 A       2/2010

*Primary Examiner* — Duc Nguyen
*Assistant Examiner* — Sean H Nguyen
(74) *Attorney, Agent, or Firm* — Mots Law, PLLC

(57) ABSTRACT

A silicon substrate has a chamber that penetrates vertically. A diaphragm is formed on the upper surface of the silicon substrate so as to cover the upper portion of the chamber. Also, a back plate is provided above the silicon substrate so as to cover the diaphragm, and a fixed electrode plate is provided on the lower surface of the back plate in opposition to the diaphragm. Multiple acoustic holes, which penetrate vertically and are for allowing the passage of acoustic vibration, are formed in the back plate (28) and the fixed electrode plate. Multiple through-holes that have a smaller opening area than the acoustic holes are formed in a large displacement region of the diaphragm.

12 Claims, 8 Drawing Sheets

(56) References Cited

U.S. PATENT DOCUMENTS

2012/0328132 A1\* 12/2012 Wang .................... H04R 19/04
381/174
2013/0223654 A1\* 8/2013 Dehe .................... B81B 3/0078
381/174

\* cited by examiner (A)

(B)

ACOUSTIC TRANSDUCER

TECHNICAL FIELD

The present invention relates to an acoustic transducer. Specifically, the present invention relates to an acoustic transducer for converting detected acoustic vibration into an electrical signal.

RELATED ART

There are cases where a through-hole is formed in the diaphragm of an acoustic sensor in order to increase the roll-off frequency. In an acoustic sensor 11 shown in FIGS. 1(A) and 1(B), a chamber 13 that penetrates vertically is formed in a substrate 12, and a diaphragm 14 is provided above the substrate 12 so as to cover the upper portion of the chamber 13. A back plate 15 is provided on the upper surface of the substrate 12 so as to cover the diaphragm 14, and a fixed electrode plate 16 that opposes the diaphragm 14 is provided on the lower surface of the back plate 15. Multiple acoustic holes 17 for guiding acoustic vibration into the air gap between the fixed electrode plate 16 and the diaphragm 14 are formed in the back plate 15 and the fixed electrode plate 16. Also, a through-hole 18 having a larger opening area than the acoustic holes 17 is formed in a large displacement region of the diaphragm 14, that is to say the region of the diaphragm 14 that opposes the upper opening of the chamber 13. This type of acoustic sensor is disclosed in Patent Document 1, for example.

In this acoustic sensor 11, acoustic vibration that has entered the air gap between the fixed electrode plate 16 and the diaphragm 14 through the acoustic holes 17 escapes into the chamber 13 through the gap (vent hole) between the lower surface of the outer peripheral portion of the diaphragm 14 and the upper surface of the substrate 12. Also, if the through-hole 18 is formed in the diaphragm 14, acoustic vibration that has entered the air gap through the acoustic holes 17 escapes into the chamber 13 through the through-hole 18 in the diaphragm 14 as well. For this reason, if the through-hole 18 is formed in the diaphragm 14, the resistance to acoustic vibration (acoustic resistance) decreases, and the roll-off frequency of the acoustic sensor 11 increases.

FIG. 2 is a diagram showing the sensitivity ratio of an acoustic sensor, with the horizontal axis showing the frequency (vibration frequency) of the acoustic vibration and the vertical axis showing the sensitivity ratio. The curve indicated by a dashed line in FIG. 2 is the sensitivity ratio-to-frequency characteristic (hereinafter, called the frequency characteristic) when the through-hole 18 has not been formed in the diaphragm 14. In contrast, in the case where the through-hole 18 has been formed in the diaphragm 14, the sensitivity ratio of the acoustic sensor decreases in the low-pitch range (low frequency range) as with the frequency characteristic indicated by a solid line in FIG. 2. This reduction in the sensitivity ratio in the low-pitch range is called roll-off (effect).

With the acoustic sensor 11 that is rolled-off by forming the through-hole 18 in the large displacement region of the diaphragm 14, it is possible to improve environmental resistance such as wind noise resistance, compressed air resistance, and air pressure variation resistance. Specifically, since the diaphragm 14 is not likely to be shaken by wind entering through the acoustic holes 17 or the chamber 13, it is not likely to detect wind as sound (wind noise resistance). Also, if the acoustic sensor 11 is dropped for example, wind pressure is sometimes applied to the chamber 13 (particularly in the case of a bottom port type of microphone), the air inside the chamber 13 is compressed by the wind pressure, and the air pressure rises. In this case as well, if the through-hole 18 has been formed in the diaphragm 14, the diaphragm 14 is not likely to be subjected to compressed air, and the diaphragm 14 is not likely to become damaged due to compressed air (compressed air resistance). Also, in the case where the lower surface of the chamber 13 or the like is blocked, even if the air pressure (atmospheric pressure) on the air gap side temporarily changes, the pressure force escapes through the through-hole 18, and the pressure variation is not likely to be detected as sound (air pressure variation resistance).

However, as shown in FIG. 3, with the conventional acoustic sensor 11, a diameter D of the through-hole 18 formed in the diaphragm 14 is the same as or larger than a diameter d of the acoustic holes 17. In particular, in the case of use in a bottom port type of microphone, the through-hole 18 of the diaphragm 14 is even larger. Since a large through-hole 18 is provided in the diaphragm 14 in this acoustic sensor 11, the sacrifice layer between the diaphragm 14 and the fixed electrode plate 16 falls into the through-hole 18 during film formation, and a level difference δ appears in the back plate 15 and the fixed electrode plate 16 at locations corresponding to the edge of the through-hole 18 as shown in FIG. 3. As a result, there is a risk of a decrease in the strength of the back plate 15 and the appearance of some locations in the fixed electrode plate 16 where conduction is incomplete.

Note that Patent Document 2 also discloses an acoustic sensor in which through-holes are formed in the diaphragm. However, in this sensor, the through-holes are provided not in the large displacement region of the diaphragm, but rather in the region that opposes the substrate upper surface in the outer peripheral portion of the diaphragm (vent hole portion). With these through-holes, the resistance is high when acoustic vibration passes through, and therefore there is almost no improvement in environmental resistance such as compressed air resistance and wind noise resistance. Also, a large number of through-holes needs to be provided in order to improve the roll-off effect, but if a large number of through-holes is provided in the vent hole portion that has a limited area, there are problems such as the mechanical strength dropping and the sensitivity dropping due to the reduction in the electrode area.

RELATED ART DOCUMENTS

Patent Documents

Patent Document 1: US Patent Application No. 2012/0033831, Specification (US 2012/0033831 A1), paragraph [0043]

Patent Document 2: JP 2010-34641A

SUMMARY OF THE INVENTION

Problem to be Solved by the Invention

An object of the present invention is to, in an acoustic transducer having improved environmental resistance due to forming through-holes in the vibrating electrode plate, achieve a further improvement in the characteristics of the acoustic transducer by setting the size of the through-holes in the vibrating electrode plate smaller than that of the acoustic holes (acoustic holes).

Means for Solving the Problems

An acoustic transducer according to the present invention includes: a substrate having a cavity that is open at least at an upper surface; a vibrating electrode plate formed above the substrate so as to cover an upper portion of the cavity; a back plate formed above the substrate so as to cover the vibrating electrode plate; and a fixed electrode plate provided on the back plate, wherein the back plate and the fixed electrode have a plurality of acoustic holes that penetrate vertically, and in this acoustic transducer, a plurality of through-holes having a smaller opening area than the acoustic holes are formed in a large displacement region of the vibrating electrode plate.

In this acoustic transducer of the present invention, multiple through-holes having a smaller opening area than the acoustic holes are formed in the large displacement region of the vibrating electrode plate, thus making it possible to roll-off the sensitivity in the low-pitch range, and making it possible to improve environmental resistance such as wind noise resistance, compressed air resistance, and air pressure variation resistance. Also, since the opening area of the through-holes is small, in the case of being used in a bottom port type of microphone or the like, foreign objects are not likely to intrude into the air gap between the vibrating electrode plate and the fixed electrode plate from the cavity side. Note that the large displacement region of the vibrating electrode plate referred to here is a region that includes the maximum displacement location of the vibrating electrode plate and the periphery thereof.

Since the opening area of the through-holes is smaller, it is not likely for the through-holes to become filled with the sacrifice layer for forming the air gap between the vibrating electrode plate and the fixed electrode plate in the manufacturing process for the acoustic transducer, and for a level difference to appear in the back plate or the fixed electrode plate. As a result, the strength of the back plate and the fixed electrode plate is not likely to decrease due to a level difference, and a conduction failure is not likely to occur in the fixed electrode plate. In particular, if the width of the through-holes is less than two times that of the air gap, it is not likely for the through-holes to become filled with the sacrifice layer formed for air gap formation, and for a level difference to appear in the back plate or the fixed electrode plate.

Also, since the opening area of the through-holes is small, the number of through-holes needs to be increased in order to obtain the necessary roll-off effect, but the through-holes are provided in a dispersed manner in the large displacement region of the vibrating electrode plate. As a result, it is possible to efficiently mitigate thermal noise in the air gap sandwiched between the vibrating electrode plate and the fixed electrode plate, and it is possible to improve the S/N ratio of the acoustic transducer. The large displacement region of the vibrating electrode plate is the region in which the vibrating electrode plate undergoes a large amount of displacement when thermal noise occurs, and thus the amount of noise in the acoustic transducer increases. Accordingly, the large displacement region of the vibrating electrode plate is the region for which there is the greatest desire to mitigate thermal noise, and the existence of the through-holes in this region makes it possible to greatly improve the S/N ratio of the acoustic transducer.

A central portion of the vibrating electrode plate is particularly preferable as a region in which the plurality of through-holes are formed. In the acoustic transducer, if the vibrating electrode plate is arranged so as to cover the chamber, the fixing portion of the vibrating electrode plate is often the peripheral portion (e.g., the substrate). If the diaphragm is fixed using the peripheral portion, the displacement of the vibrating electrode plate is particularly large in the central portion, and therefore if the through-holes for mitigating thermal noise are provided in the central portion of the vibrating electrode plate, the effect of improving the S/N ratio of the acoustic transducer is large. In particular, displacement of the vibrating electrode plate is large in the region from the center of the vibrating electrode plate up to half the distance to the edge, and it is desirable that the through-holes are provided in this region.

In an embodiment of the acoustic transducer according to the present invention, the through-holes are provided in the vibrating electrode plate at positions that are not overlapped with the acoustic holes in a view from a direction perpendicular to the upper surface of the substrate. If the through-holes and the acoustic holes are provided so as to be overlapped with each other, the acoustic resistance decreases, and the roll-off effect is too effective, and therefore the number of through-holes is limited. In contrast, if the through-holes are arranged so as to not be overlapped with the acoustic holes, the number of through-holes can be increased even in the case of attempting to achieve an appropriate roll-off effect, and thermal noise can be efficiently mitigated.

Also, in the above embodiment, it is preferable to arrange the through-holes in regions sandwiched by two adjacent acoustic holes or in regions surrounded by three or more acoustic holes in a view from a direction perpendicular to the upper surface of the substrate. If the through-holes are arranged in this way, the through-holes can be provided at locations distant from the acoustic holes, and therefore it is possible to improve the roll-off effect in the acoustic sensor, and the effect of reducing thermal noise also improves.

In yet another embodiment of the acoustic transducer according to the present invention, the through-holes are arranged regularly. In the case where the acoustic holes are arranged regularly, if the through-holes are also arranged regularly, it is easy to arrange the through-holes and the acoustic holes so as to not be overlapped with each other. Also, if the through-holes are arranged regularly, it is possible to effectively mitigate thermal noise in the region in which they are arranged, and it is possible to further improve the S/N ratio of the acoustic transducer. In particular, it is preferable that a pitch of the through-holes is an integer multiple of a pitch of the acoustic holes. By setting the pitch of the through-holes to an integer multiple of the pitch of the acoustic holes, the through-holes and the acoustic holes can both be arranged in regular arrangements.

A first microphone according to the present invention is a microphone having an acoustic transducer according to the present invention implemented inside a package, wherein the substrate has the cavity that penetrates from an upper surface to a lower surface, a sound introduction hole for introducing acoustic vibration into the package is formed in the package, and the sound introduction hole and a lower portion of the cavity are connected. According to this microphone, it is possible to improve environmental resistance such as wind noise resistance, compressed air resistance, and air pressure variation resistance, and it is possible to improve the strength of the acoustic transducer.

A second microphone according to the present invention is a microphone in which an acoustic transducer according to the present invention and a circuit portion that amplifies a signal from the acoustic transducer and outputs the amplified signal to the outside are implemented in a package. According to this microphone, it is possible to improve environmental resistance such as wind noise resistance, compressed air resistance, and air pressure variation resistance, and it is possible to improve the strength of the acoustic transducer.

Note that the solution to the problems in the present invention features an appropriate combination of the above-described constituent elements, and many variations of the present invention are possible according to the combination of the constituent elements.

INDEX TO THE REFERENCE NUMERALS

Figure 1:
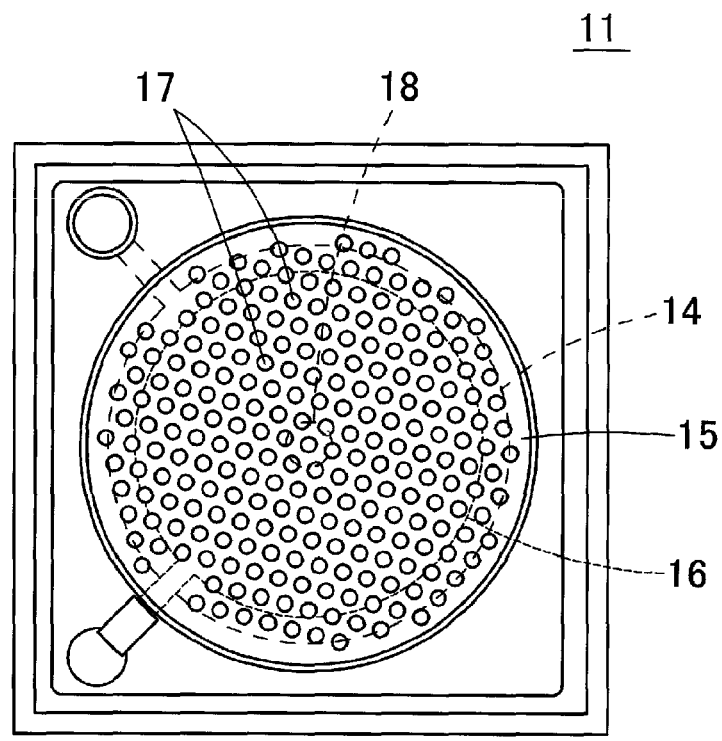
FIG. 1(A) is a plan view showing a conventional acoustic sensor.
FIG. 1(B) is a cross-sectional diagram of the conventional acoustic sensor.
Figure 1:
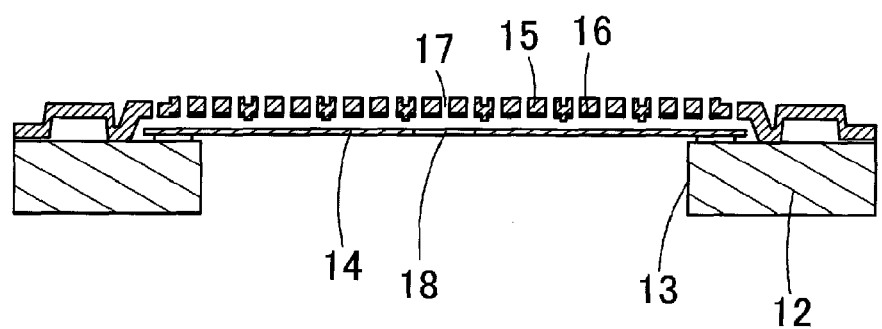
Figure 2:
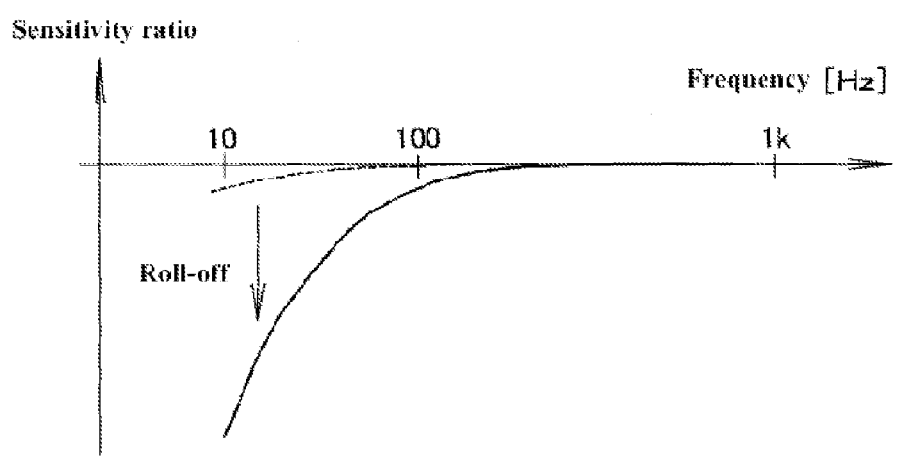
FIG. 2 is a diagram for describing the roll-off effect in an acoustic sensor.
Figure 3:
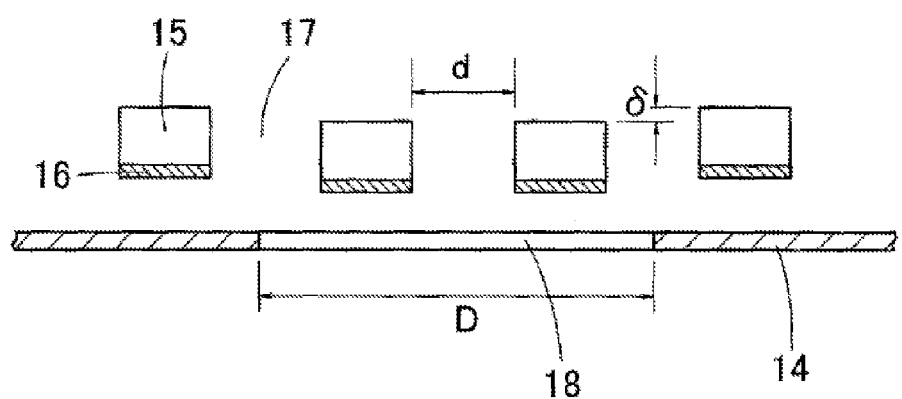
FIG. 3 is a schematic cross-sectional diagram for describing a problem to be solved in the conventional acoustic sensor.

21 Acoustic sensor
22 Silicon substrate
23 Diaphragm (fixed electrode plate)
25 Chamber (cavity)
26 Anchor
27 Through-hole
28 Back plate
29 Fixed electrode plate
31 Acoustic hole
41 Microphone
44 Signal processing circuit (circuit portion)
45 Sound introduction hole

EMBODIMENTS OF THE INVENTION

Hereinafter, preferred embodiments of the present invention will be described with reference to the accompanying drawings. Note that the present invention is not limited to the following embodiments, and various design modifications can be made without departing from the gist of the present invention.

Embodiment 1

Figure 4:
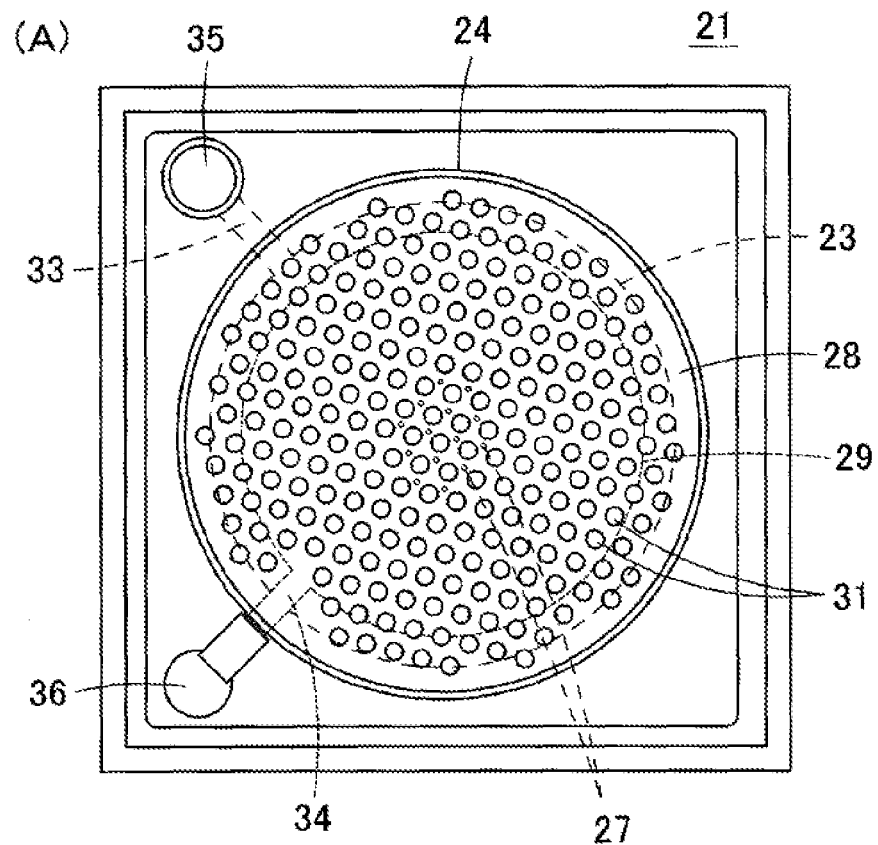
FIG. 4(A) is a plan view showing an acoustic sensor according to Embodiment 1 of the present invention.
FIG. 4(B) is a diagram showing a positional relationship between acoustic holes, through-holes in a diaphragm, and stoppers in the acoustic sensor of Embodiment 1.
Figure 4:
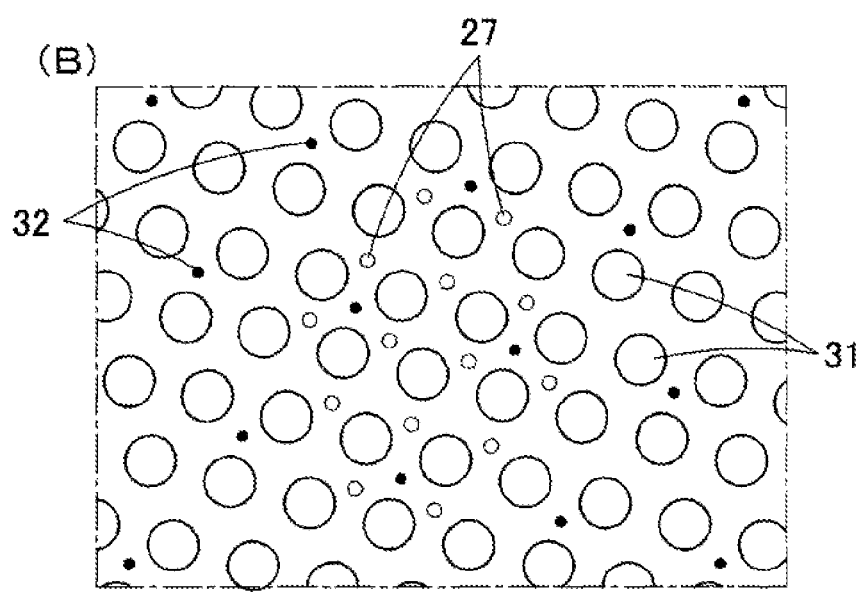
Figure 5:
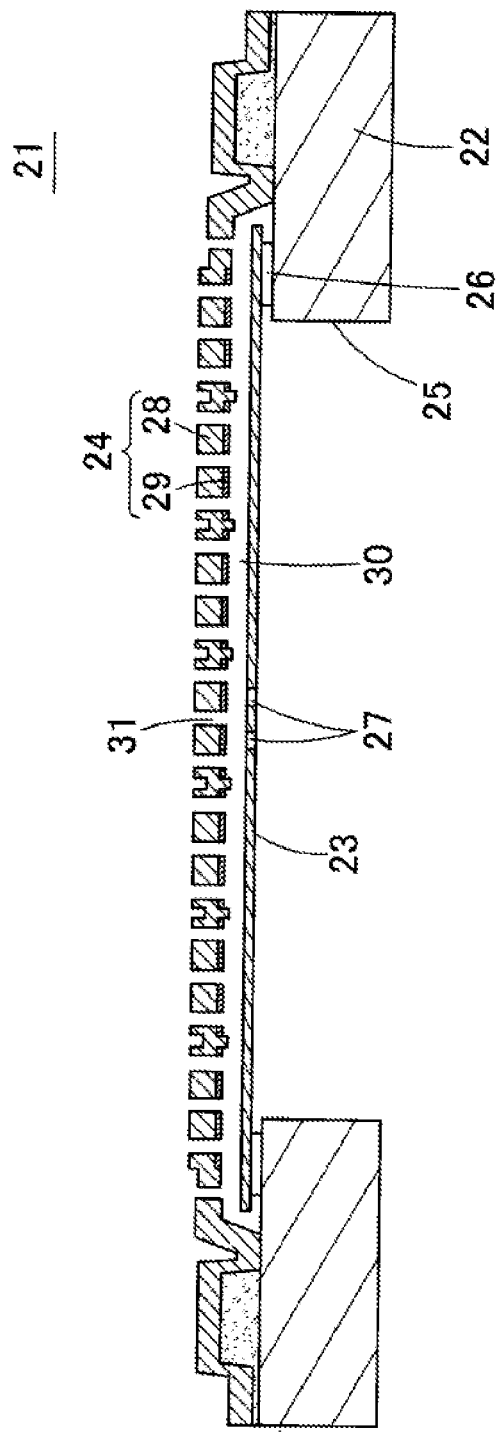
FIG. 5 is a cross-sectional diagram of the acoustic sensor of Embodiment 1.
Figure 6:
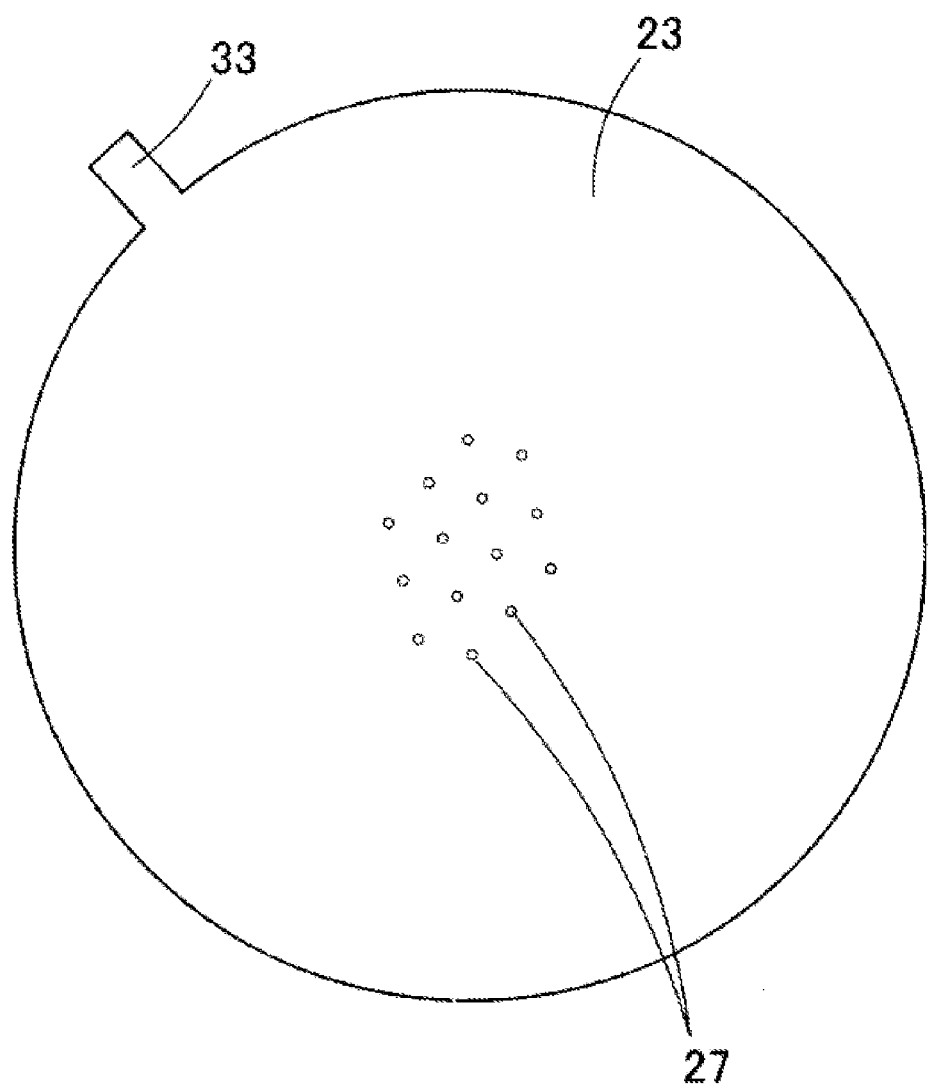
FIG. 6 is a plan view of the diaphragm used in the acoustic sensor of Embodiment 1.

Hereinafter, the structure of an acoustic transducer according to Embodiment 1 of the present invention, that is to say an acoustic sensor 21, will be described with reference to FIGS. 4 to 6. FIG. 4(A) is a plan view of the acoustic sensor 21 according to Embodiment 1 of the present invention. FIG. 4(B) is a plan view showing an enlargement of a portion of the acoustic sensor 21, and shows the positional relationship between acoustic holes 31, through-holes 27 in a diaphragm 23, and stoppers 32. FIG. 5 is a cross-sectional diagram of the acoustic sensor 21. FIG. 6 is a plan view of the diaphragm 23.

This acoustic sensor 21 is a capacitive element manufactured using MEMS technology. As shown in FIG. 5, this acoustic sensor 21 has a diaphragm 23 that is provided on the upper surface of a silicon substrate 22 (substrate) via anchors 26, and a canopy portion 24 that is arranged above the diaphragm 23 via a very small air gap 30 (air gap) and is fixed to the upper surface of the silicon substrate 22.

A chamber 25 (cavity) that penetrates from the upper surface to the lower surface is formed in the silicon substrate 22. The diaphragm 23 is arranged on the upper surface of the silicon substrate 22 so as to cover the upper opening of the chamber 25. The diaphragm 23 is formed by an electrically conductive polysilicon thin film and has an approximately discoid shape, and the diaphragm 23 itself is a vibrating electrode plate. Multiple anchors 26 are arranged on the upper surface of the silicon substrate 22 with gaps therebetween, in the periphery of the chamber 25. The lower surface of the outer peripheral portion of the diaphragm 23 is supported by the anchors 26 on the upper surface of the silicon substrate 22, and floats above the upper opening of the chamber 25 and the upper surface of the silicon substrate 22. As shown in FIG. 6, multiple through-holes 27 that penetrate vertically are arranged regularly with a constant pitch in a large displacement region of the diaphragm 23, that is to say the region that opposes the upper opening in the silicon substrate 22 (preferably, the central portion of the diaphragm 23). Also, a lead-out interconnect 33 is drawn from the diaphragm 23.

As shown in FIG. 5, the canopy portion 24 is obtained by providing a fixed electrode plate 29 made of polysilicon on the lower surface of a back plate 28 made of SiN. The canopy portion 24 is formed with a dome shape and has a cavity portion underneath the dome, and the diaphragm 23 is covered by the cavity portion. A very small air gap 30 (air gap) is formed between the lower surface of the canopy portion 24 (i.e., the lower surface of the fixed electrode plate 29) and the upper surface of the diaphragm 23. As shown in FIG. 4(A), a lead-out interconnect 34 is drawn out from the fixed electrode plate 29.

Many acoustic holes 31 (acoustic holes) for allowing the passage of acoustic vibration are formed in the canopy portion 24 (i.e., the back plate 28 and the fixed electrode plate 29) so as to penetrate from the upper surface to the lower surface. As shown in FIG. 4(A), the acoustic holes 31 are arranged regularly. In the illustrated example, the acoustic holes 31 are arranged in a triangular manner along three directions that form 120° angles with each other, but they may be arranged in a rectangular manner or a concentric circle manner. Also, protruding stoppers 32 are arranged at appropriate intervals on the lower surface of the back plate 28. The stoppers 32 penetrate the fixed electrode plate 29 and protrude to a position below the fixed electrode plate 29, and prevent the diaphragm 23 from sticking (adhering) to the fixed electrode plate 29.

Also, electrode pads 35 and 36 are provided on the upper surface of the back plate 28. The lead-out interconnect 33 of the diaphragm 23 is connected to the electrode pad 35, and the lead-out interconnect 34 of the fixed electrode plate 29 is connected to the electrode pad 36.

In the acoustic sensor 21, the fixed electrode plate 29 and the diaphragm 23 oppose each other via the air gap 30 so as to constitute a capacitor structure. When the diaphragm 23 vibrates in response to acoustic vibration, the capacitance between the fixed electrode plate 29 and the diaphragm 23 changes, and the acoustic vibration is converted into an electrical signal through this change in the capacitance.

Here, the opening area of the through-holes 27 (or the diameter in the case where the through-holes 27 are circular) is smaller than the opening area (or the diameter) of the acoustic holes 31. The through-holes 27 are arranged at positions out of alignment with the acoustic holes 31 so as to not be overlapped with the acoustic holes 31 in a view from a direction perpendicular to the upper surface of the silicon substrate 22. For example, the through-holes 27 are arranged at the center between two adjacent acoustic holes 31, or at the center of a region surrounded by three or more acoustic holes 31. In FIG. 4(B), each through-hole 27 in the diaphragm 23 is located at the center of a region surrounded by three acoustic holes 31, and the arrangement pitch of the through-holes 27 is equivalent to the arrangement pitch of the acoustic holes 31.

Figure 7:
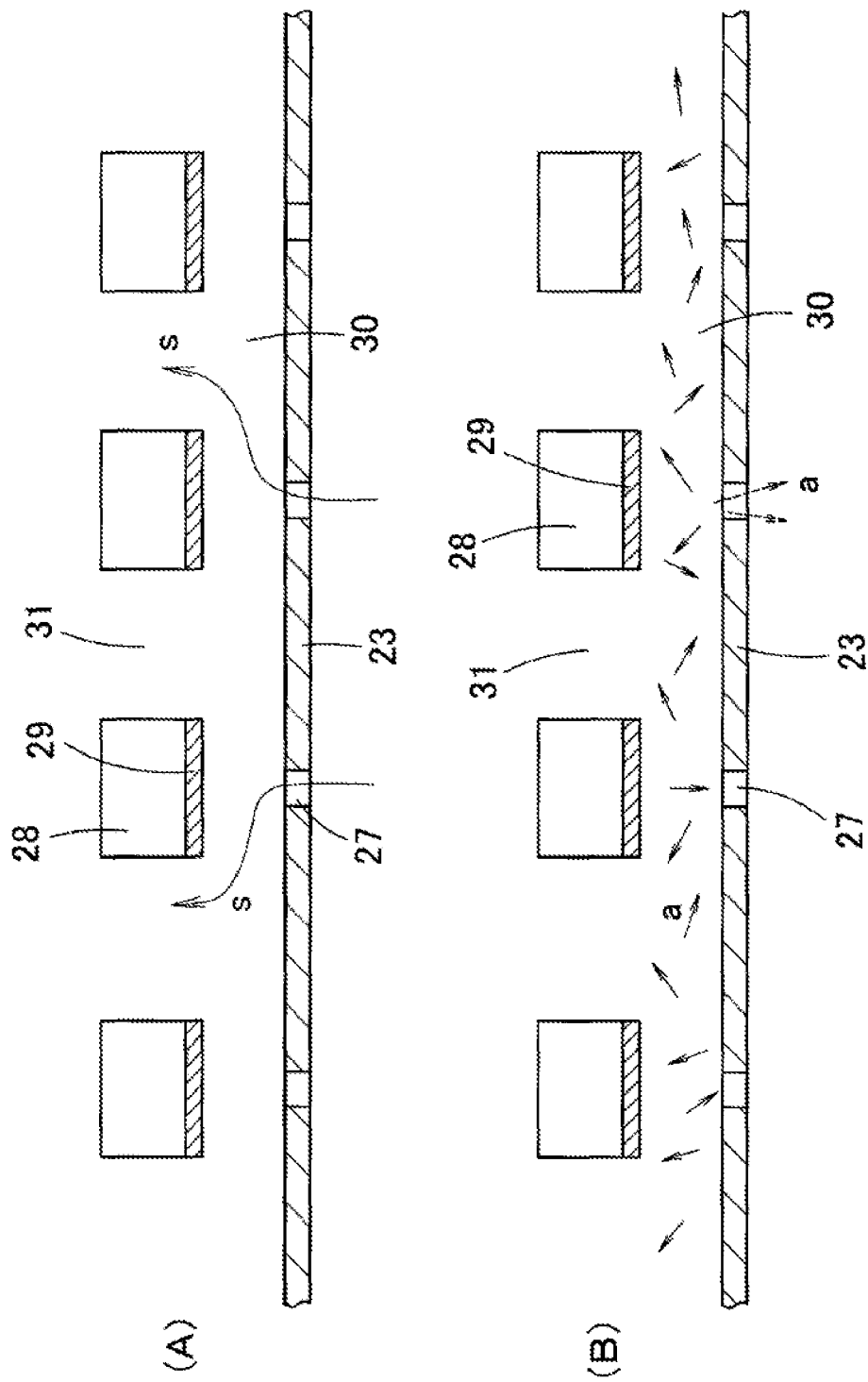
FIGS. 7(A) and 7(B) are diagrams for describing operations and effects of the acoustic sensor of Embodiment 1.

In the acoustic sensor 21 described above, the through-holes 27 are formed in the large displacement region of the diaphragm 23, and therefore as shown in FIG. 7(A), acoustic vibration s can pass from the chamber 25 side into the air gap 30 through the through-holes 27, or pass from the air gap 30 into the chamber 25. For this reason, according to the acoustic sensor 21, it is possible to roll-off the sensitivity in the low-pitch range likewise to the conventional example, and it is possible to improve environmental resistance such as wind noise resistance, compressed air resistance, and air pressure variation resistance. Also, in the acoustic sensor 21 of the present embodiment, the opening area of the through-holes 27 is smaller than that of the acoustic holes 31, and therefore although the roll-off effect per through-hole 27 is small, environmental resistance greater than or the same as in the conventional example can be obtained by increasing the number of through-holes 27 while keeping the opening area of the through-holes 27 smaller than that of the acoustic holes 31.

Also, since the opening area of the through-holes 27 is small in the acoustic sensor 21, in the case of being used in a bottom port type of microphone or the like, foreign objects such as dirt and dust are not likely to intrude into the air gap 30 from the chamber 25 side.

Furthermore, in the acoustic sensor 21 of the present embodiment, multiple through-holes 27 having a smaller opening area than the acoustic holes 31 can be provided in a dispersed manner in a large displacement region of the diaphragm 23, thus making it possible to mitigate thermal noise in the air gap 30 and improve the S/N ratio of the acoustic sensor 21. As shown in FIG. 7(B), thermal noise in the air gap 30 is electrical noise generated in the air layer in the air gap 30 sandwiched between the diaphragm 23 and the fixed electrode plate 29 due to air molecules a in this air layer undergoing Brownian motion and colliding with the diaphragm 23. Here, if a large number of small through-holes 27 are provided in the diaphragm 23, the air molecules a in the air gap 30 can escape through the through-holes 27, and the number of air molecules a that collide with the diaphragm 23 per unit of time commensurately decreases, and thermal noise is mitigated. Moreover, the large displacement region of the diaphragm 23 is the region of the diaphragm 23 that has a high sensitivity, and therefore if thermal noise is mitigated by providing the through-holes 27 in this portion, the effect of improving the S/N ratio of the acoustic sensor 21 is enhanced.

Also, if the through-holes 27 and the acoustic holes 31 are provided so as to be overlapped with each other, the acoustic resistance of the acoustic sensor decreases, and the roll-off effect is too effective, and therefore the number of through-holes 27 is limited. In order to improve the S/N ratio of the acoustic sensor, a technique is often applied in which the ratio of acoustic holes 31 is increased to further mitigate thermal noise in the air gap 30 by the acoustic holes 31. Particularly in this case, it is likely for the through-holes 27 and the acoustic holes 31 to be overlapped with each other. In contrast, in the acoustic sensor 21 of the present embodiment, the through-holes 27 are arranged so as to not be overlapped with the acoustic holes 31, and therefore the number of through-holes 27 can be increased even in the case of attempting to achieve an appropriate roll-off effect. Accordingly, it is possible to substantially mitigate thermal noise and improve the S/N ratio of the acoustic sensor 21.

Figure 8:
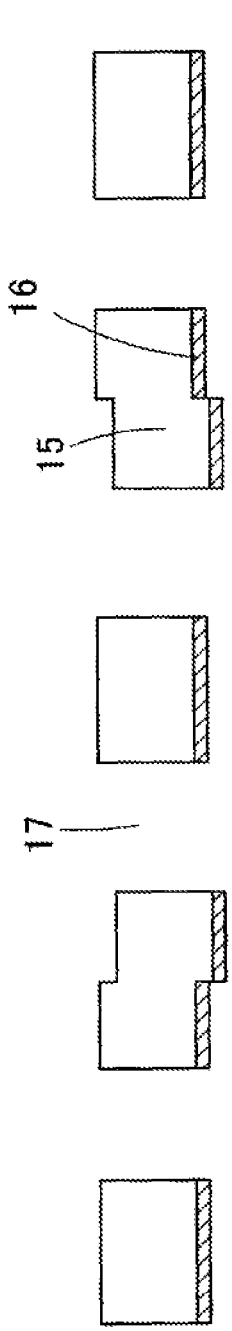
FIG. 8(A) is a schematic diagram showing how a level difference appears in a back plate in a conventional acoustic sensor.
FIG. 8(B) is a schematic diagram illustrating a reason why a level difference does not appear in a back plate in the acoustic sensor of Embodiment 1.
Figure 8:
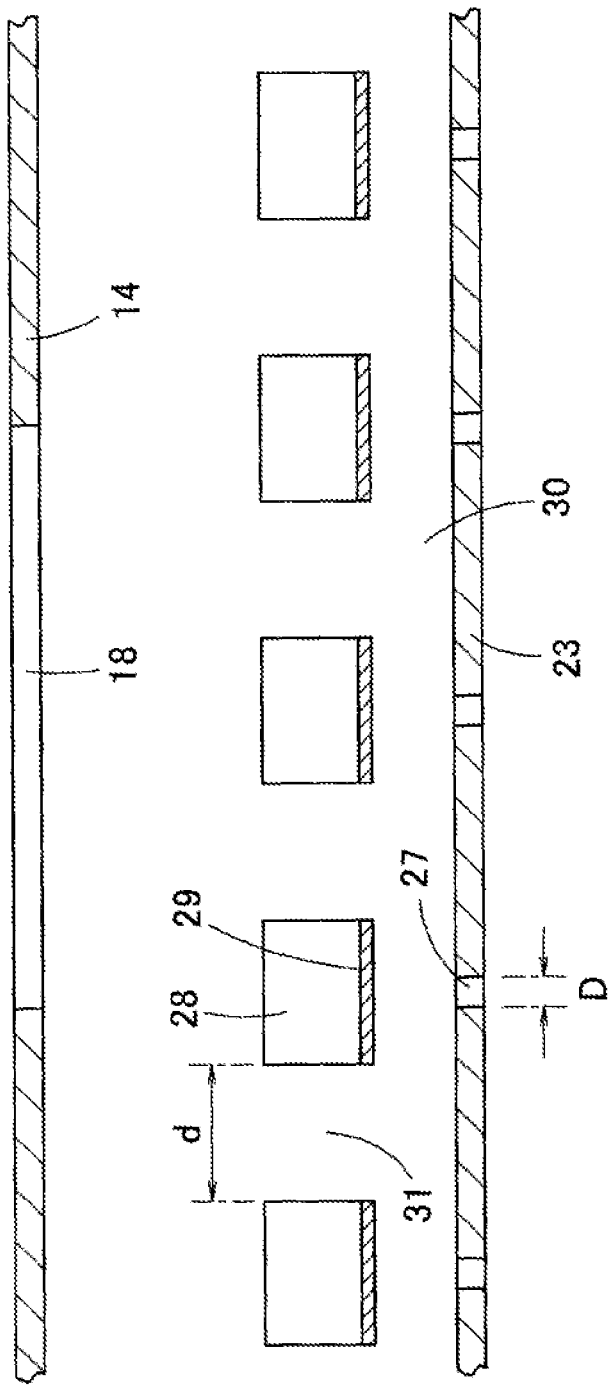

If the opening area of the through-holes 27 is large, a level difference appears in the back plate 15 and the fixed electrode plate 16 at locations corresponding to the edge of the through-hole 18 as in the conventional example shown in FIG. 8(A), and there is a risk of the strength of the back plate 15 and the fixed electrode plate 16 decreasing and a conduction fault occurring in the fixed electrode plate 16. In contrast, even in the case where the through-holes 27 are provided so as to not be overlapped with the acoustic holes 31, if the opening area of the through-holes 27 (the diameter D) is smaller than the opening area of the acoustic holes 31 (the diameter d), it is not likely for the through-holes 27 to become filled with the sacrifice layer for forming the air gap 30 between the diaphragm 23 and the fixed electrode plate 29 in the manufacturing process, and for a level difference to appear in the upper surface of the back plate 28 or the like. Accordingly, the strength of the back plate 28 is not likely to decrease due to a level difference, and some locations where conduction is incomplete are not likely to appear in the fixed electrode plate 29.

In the case where the through-holes 27 are approximately circular, it is desirable that the diameter of the through-holes 27 is 10 µm or less. More preferably, it is 1 µm or more and 5 µm or less. This is because if the diameter of the through-holes 27 is 10 µm or less, a level difference is not likely to appear in the back plate 28 or the like, or the level difference is small.

Furthermore, the portions of the diaphragm 23 that oppose the center between two adjacent acoustic holes 31 or the center of a region surrounded by three or more acoustic holes 31 are portions farthest away from the acoustic holes 31. For this reason, if the through-holes 27 are provided at positions opposing the center between two adjacent acoustic holes 31 or the center of a region surrounded by three or more acoustic holes 31, it is possible to improve the roll-off effect in the acoustic sensor 21, and the effect of reducing thermal noise also improves.

Note that if the acoustic holes 31 are arranged regularly with a constant pitch, it is desirable that the through-holes 27 are also arranged regularly with a constant pitch. This is because it is becomes simple to arrange the through-holes 27 so as to not be overlapped with the acoustic holes 31. In particular, arrangement is easier if the pitch of the through-holes 27 is the same interval as the acoustic holes 31, or an interval that is an integer multiple thereof.

Application in Microphone

Figure 9:
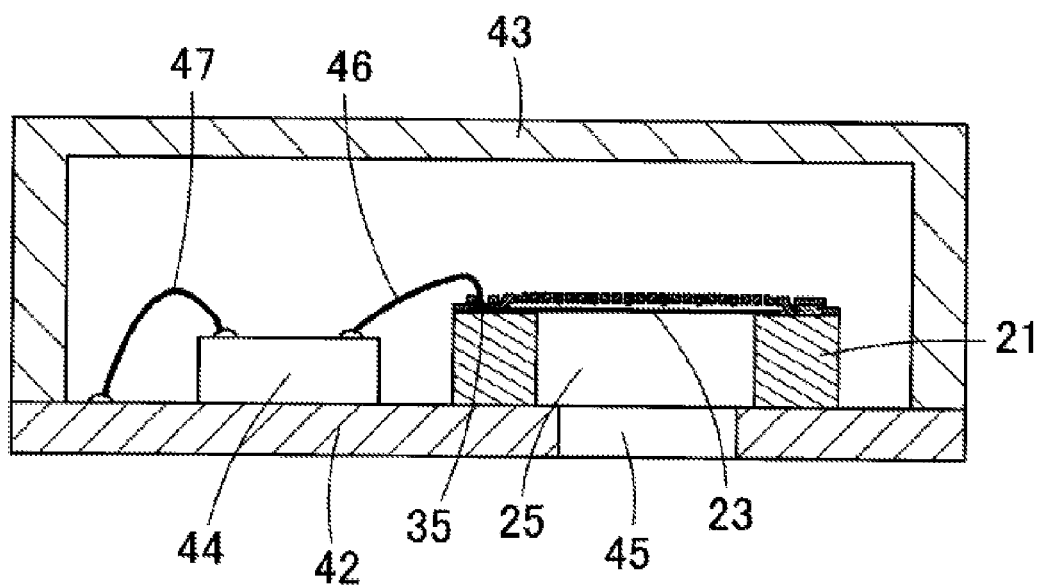
FIG. 9 is a schematic cross-sectional diagram of a microphone having an acoustic sensor according to the present invention built therein.

FIG. 9 is a schematic cross-sectional diagram of a bottom port type of microphone 41 having the acoustic sensor 21 of Embodiment 1 built therein. This microphone 41 has the acoustic sensor 21 and a signal processing circuit 44 (ASIC), which is a circuit portion, built into a package made up of a circuit substrate 42 and a cover 43. The acoustic sensor 21 and the signal processing circuit 44 are mounted on the upper surface of the circuit substrate 42. A sound introduction hole 45 for the introduction of acoustic vibration into the acoustic sensor 21 is formed in the circuit substrate 42. The acoustic sensor 21 is mounted on the upper surface of the circuit substrate 42 such that the lower opening of the chamber 25 is aligned with the sound introduction hole 45 and covers the sound introduction hole 45. Accordingly, the chamber 25 of the acoustic sensor 21 is the front chamber, and the space inside the package is the back chamber.

The electrode pads 35 and 36 of the acoustic sensor 21 are connected to the signal processing circuit 44 by a bonding wire 46. Furthermore, the signal processing circuit 44 is connected to the circuit substrate 42 by a bonding wire 47. Note that the signal processing circuit 44 has a function of supplying power to the acoustic sensor 21 and a function of outputting a capacitance change signal from the acoustic sensor 21 to the outside.

The cover 43 is attached to the upper surface of the circuit substrate 42 so as to cover the acoustic sensor 21 and the signal processing circuit 44. The package has an electromagnetic shielding function, and protects the acoustic sensor 21 and the signal processing circuit 44 from mechanical shock and electrical disturbances from the outside.

In this way, acoustic vibration that has entered the chamber 25 through the sound introduction hole 45 is detected by the acoustic sensor 21, and then output after being subjected to amplification and signal processing by the signal processing circuit 44. Since the space inside the package is the back chamber in this microphone 41, the volume of the back chamber can be increased, and the sensitivity of the microphone 41 can be increased.

In the case of use in this bottom port type of microphone 41, the area of the through-holes 27 in the diaphragm 23 needs to be increased in order to improve the environmental resistance. In this case, it is sufficient to meet this need by increasing the number of through-holes 27 without increasing the opening area of the individual through-holes 27, or increasing it with the limit of being smaller than the opening area of the individual acoustic holes 31.

Note that in this microphone 41, the sound introduction hole 45 for introducing acoustic vibration into the package may be formed in the upper surface of the cover 43. In this case, the chamber 25 of the acoustic sensor 21 is the back chamber, and the space inside the package is the front chamber.

The invention claimed is:

1. An acoustic transducer comprising:
   a substrate having a cavity that is open at least at an upper surface;
   a vibrating electrode plate formed above the substrate so as to cover an upper portion of the cavity;
   a back plate formed above the substrate so as to cover the vibrating electrode plate; and
   a fixed electrode plate provided on the back plate,
   wherein the back plate and the fixed electrode plate have a plurality of acoustic holes that penetrate vertically, and
   a plurality of through-holes each having a smaller opening area than each of the acoustic holes are formed in a large displacement region in a central portion of the vibrating electrode plate.

2. The acoustic transducer according to claim 1, wherein the through-holes are provided in the vibrating electrode plate at positions that are not overlapped with the acoustic holes in a view from a direction perpendicular to the upper surface of the substrate.

3. The acoustic transducer according to claim 2, wherein the through-holes are arranged in regions sandwiched by two adjacent acoustic holes or in regions surrounded by three or more acoustic holes in a view from a direction perpendicular to the upper surface of the substrate.

4. The acoustic transducer according to claim 1, wherein the through-holes are arranged regularly.

5. The acoustic transducer according to claim 4, wherein a pitch of the through-holes is an integer multiple of a pitch of the acoustic holes.

6. A microphone having the acoustic transducer according to claim 1 implemented inside a package,
   wherein the substrate has the cavity that penetrates from an upper surface to a lower surface,
   a sound introduction hole for introducing acoustic vibration into the package is formed in the package, and
   the sound introduction hole and a lower portion of the cavity are connected.

7. A microphone in which the acoustic transducer according to claim 1 and a circuit portion that amplifies a signal from the acoustic transducer and outputs the amplified signal to the outside are implemented in a package.

8. The acoustic transducer according to claim 1, wherein a width of each of the through-holes is smaller than two times that of an air gap between the vibrating electrode and the fixed electrode.

9. The acoustic transducer according to claim 1, wherein a region of the vibrating electrode plate that faces the cavity of the substrate continuously extends except for the through-holes.

10. The acoustic transducer according to claim 1, wherein the large displacement region in the central portion of the vibrating electrode plate continuously extends except for the through-holes.

11. The acoustic transducer according to claim 1, wherein each of the through-holes is arranged at a center of a region between two adjacent acoustic holes or at a center of a region surrounded by three or more acoustic holes in a view from a direction perpendicular to the upper surface of the substrate.

12. The acoustic transducer according to claim 1, wherein the plurality of through-holes each having a smaller opening area than each of the acoustic holes are formed in the large displacement region in the central portion of the vibrating electrode plate such that the acoustic transducer increases a roll-off frequency thereof.

* * * * *